(12) United States Patent
Lim

(10) Patent No.: US 8,043,770 B2
(45) Date of Patent: Oct. 25, 2011

(54) PHOTOMASK AND METHOD OF FORMING OVERLAY VERNIER OF SEMICONDUCTOR DEVICE USING THE SAME

(75) Inventor: Yong Hyun Lim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 493 days.

(21) Appl. No.: 12/133,565

(22) Filed: Jun. 5, 2008

(65) Prior Publication Data
US 2009/0023079 A1     Jan. 22, 2009

(30) Foreign Application Priority Data
Jul. 16, 2007    (KR) ................. 10-2007-0071057

(51) Int. Cl.
*G03F 1/00*      (2006.01)

(52) U.S. Cl. ........................................ 430/5; 430/313

(58) Field of Classification Search .............. 430/5, 313; 428/182
See application file for complete search history.

(56) References Cited

U.S. PATENT DOCUMENTS

| | | | | |
|---|---|---|---|---|
| 5,543,252 A | * | 8/1996 | Shibata et al. | ..................... 430/5 |
| 2003/0064297 A1 | * | 4/2003 | Shiota et al. | ...................... 430/5 |
| 2006/0240359 A1 | * | 10/2006 | Liu | ............................... 430/313 |
| 2006/0251971 A1 | * | 11/2006 | Schenker | ......................... 430/5 |
| 2007/0072091 A1 | * | 3/2007 | Smith et al. | ....................... 430/5 |
| 2007/0212650 A1 | * | 9/2007 | Sim | ............................... 430/313 |
| 2008/0160261 A1 | * | 7/2008 | Kim | ............................... 428/182 |

FOREIGN PATENT DOCUMENTS

KR    10-2006-0135156      12/2006

* cited by examiner

*Primary Examiner* — Stephen Rosasco
*Assistant Examiner* — Rashid Alam
(74) *Attorney, Agent, or Firm* — Marshall, Gerstein & Borun LLP

(57) ABSTRACT

This patent relates to a photomask and a method of forming an overlay vernier of a semiconductor device employing the same. The photomask includes a reticle formed of a first material through which light can transmit, a first pattern formed on the reticle and formed of a material through which light cannot transmit, a second pattern having a size smaller than the first pattern, and an auxiliary pattern formed to come in contact with the first pattern and formed of a second material different from the first material of the reticle. Thus, inclination is formed on side portions of the overlay vernier and a thin film may be easily formed on the overlay vernier.

19 Claims, 2 Drawing Sheets

PHOTOMASK AND METHOD OF FORMING OVERLAY VERNIER OF SEMICONDUCTOR DEVICE USING THE SAME

CROSS-REFERENCES TO RELATED APPLICATIONS

This patent claims priority to Korean patent application number 10-2007-071057, filed on Jul. 16, 2007, the disclosure of which is incorporated by reference in its entirety.

TECHNICAL FIELD

This patent relates to a photomask and a method of forming an overlay vernier of a semiconductor device employing the same and, more particularly, to a method of forming an overlay vernier of a semiconductor device having inclined sides.

BACKGROUND OF THE INVENTION

Generally, when fabricating semiconductor devices, a patterning process of forming patterns on a semiconductor substrate is carried out. In this patterning process, a photoresist is first formed on an etching object layer of the semiconductor substrate. An exposure process for exposing the photoresist of regions to be removed is then performed by irradiating light to the photoresist through a photomask or a reticle. A development process is then performed in order to remove the exposed photoresist. Thus, the photoresist patterns are formed on the etching object layer.

Meanwhile, when fabricating a semiconductor device having a stack structure, it is necessary to correct an alignment state between a layer that was formed in a previous process and a layer that is formed in a current process. To this end, the photoresist patterns for forming real patterns and overlay vernier patterns, which are formed using the same photoresist in order to form overlay verniers, are formed over the etching object layer of the semiconductor substrate. Accordingly, when forming the real patterns by etching the etching object layer using the photoresist patterns, the overlay vernier patterns and the etching object layer are etched to form the overlay verniers. Here, the real pattern and the overlay vernier are formed by the same process, so that the overlay vernier has a vertical sidewall like the real pattern.

Typically, the overlay vernier is formed in a size, which is 10 times larger than that of the real pattern, and is formed independently.

The vertical sidewall of the overlay vernier may cause difficulties in a subsequent process of forming a thin film on the etching object layer over which the real patterns and the overlay verniers are formed. The real pattern has a small pattern size and a narrow gap therebetween. Hence, although the real pattern has a vertical sidewall, the thin film can be formed on the real pattern easily since the thin film is formed in a space between the real patterns. However, an overlay vernier makes it difficult to form the thin film on the sidewalls of the overlay pattern since it has a large pattern size and does not have neighboring patterns.

FIG. 2 is a scanning electron microscope (SEM) photograph of an overlay vernier formed according to the prior art. A side portion of an overlay vernier (indicated by "A") is formed vertically and has a steep step, which gives damage to a thin film (indicated by "B") formed on the overlay vernier. In this case, the degree of overlay accuracy when a lower layer is overlapped with an upper layer can be low or impossible to properly overlap the layers in the process.

BRIEF SUMMARY OF THE INVENTION

According to one aspect of the invention, an auxiliary pattern is formed in an overlay vernier light-shielding pattern by using a material having a refractive index different from a material of a reticle and an exposure process is then performed on a photoresist. Accordingly, inclination is formed on side portions of the overlay vernier and, therefore, a thin film may be formed on the overlay vernier easily.

A photomask in accordance with an aspect of the invention includes a reticle formed of a first material through which light can transmit, a first pattern formed on the reticle and is formed of a material through which light cannot transmit, a second pattern having a size smaller than the first pattern, and an auxiliary pattern formed to come in contact with the first pattern and is formed of a second material different from the first material of the reticle.

The first material may include $SiO_2$ and the second material may have a refractive index different from the first material. The second material may include air or $SiOx$ ($0.1 \leq x \leq 0.99$). The first pattern may include a pattern for forming an overlay vernier.

A method of forming an overlay vernier of a semiconductor device in accordance with another aspect of the invention includes forming an etching object layer on a semiconductor substrate, forming a photoresist on the etching object layer, performing an exposure process on the photoresist by employing a photomask where a first light-shielding pattern and a second light-shielding pattern are formed on a reticle and an auxiliary pattern, the second light-shielding pattern having a size smaller than the first light-shielding pattern, and the auxiliary pattern formed in the reticle comes in contact with the first light-shielding pattern is formed from material different from a material of the reticle, forming photoresist patterns by performing a development process on the photoresist, and etching the etching object layer by employing the photoresist patterns.

The reticle may be formed of $SiO_2$. The auxiliary pattern may be formed of material having a refractive index different from the material of the reticle. The auxiliary pattern may be formed of air or $SiOx$ ($0.1 \leq x \leq 0.99$). The photoresist pattern formed using the first light-shielding pattern may be formed to have inclined sidewalls. The photoresist pattern formed using the first light-shielding patterns may include a pattern for forming an overlay vernier.

BRIEF DESCRIPTION OF THE DRAWINGS

For a more complete understanding of the disclosure, reference should be made to the following detailed description and accompanying drawings wherein.

DETAILED DESCRIPTION

This patent is not limited to the disclosed embodiment, but may be implemented in various manners. The embodiment is provided to complete the disclosure of the patent and to allow those having ordinary skill in the art to understand the scope of the patent. This patent is defined by the category of the claims.

Figure 1A:
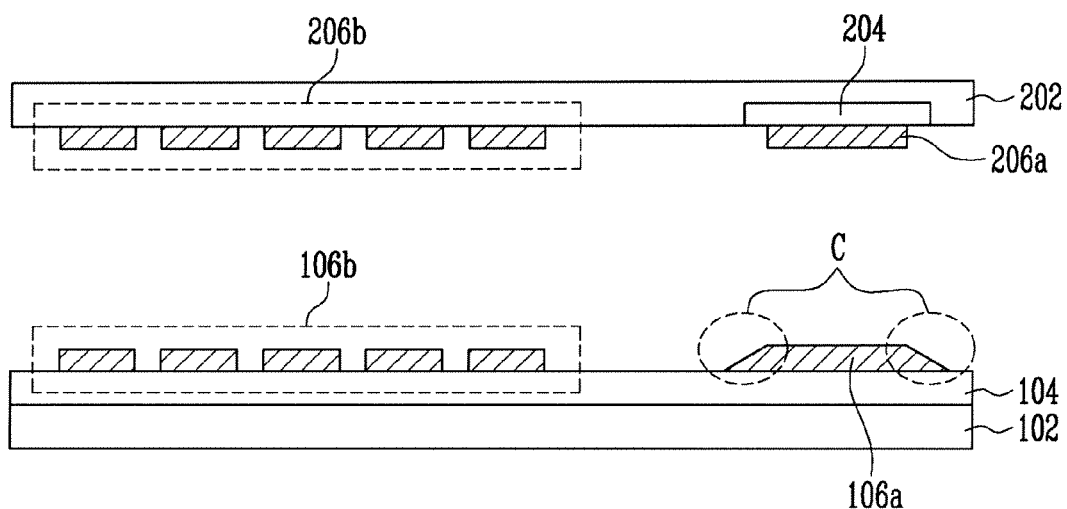
FIGS. 1A to 1C are sectional views showing a photomask and a method of forming an overlay vernier of a semiconductor device employing the same according to an embodiment of the invention.
Figure 1B:
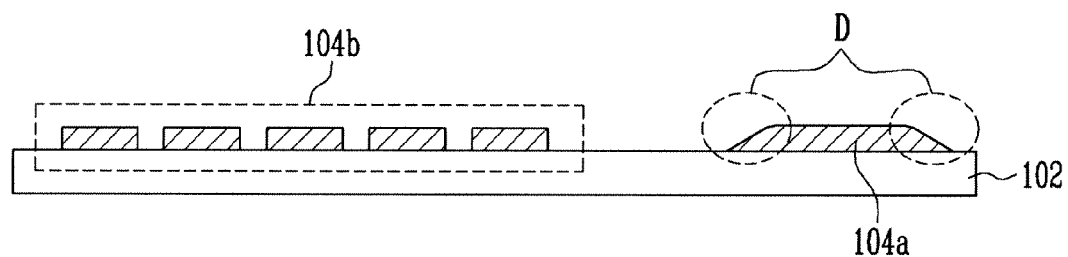
Figure 1C:
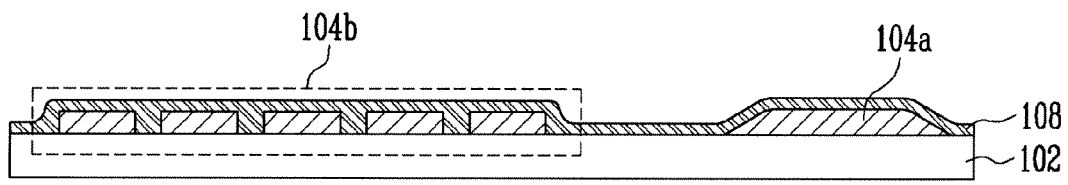
Figure 2:
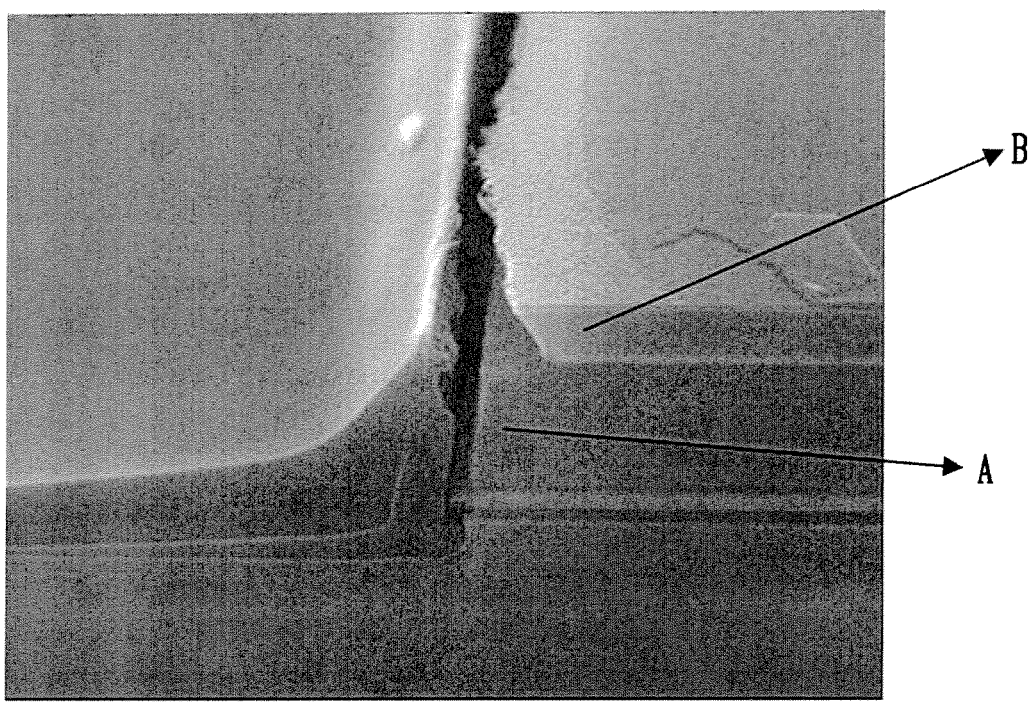
FIG. 2 is a SEM photograph of an overlay vernier formed according to the prior art.

FIGS. 1A to 1C are sectional views showing a photomask and a method of forming an overlay vernier of a semiconductor device employing the same according to an embodiment of the invention.

Referring now to FIG. 1A, an etching object layer 104 may be formed on a semiconductor substrate 102. A photoresist (not shown), which will be used, for example, in an etching process for forming photoresist patterns, may be formed on the etching object layer 104. The photoresist is patterned, for example, by development and exposure processes, thus forming photoresist patterns 106a, 106b. This is described below in more detail.

In order to form a photomask to be used in an exposure process of the photoresist, an auxiliary pattern 204 is formed in a reticle 202. The reticle 202 may be formed of a transparent material such as Silicon Dioxide ($SiO_2$). The transparent material used in the exposure process allows light to transmit therethrough. The auxiliary pattern 204 is formed within the reticle 202 and an overlay vernier pattern may be formed on a portion of the auxiliary pattern 204. The auxiliary pattern 204 may be formed to a thickness of about 0.01 to 100 µm in consideration of a wavelength of light used in the exposure process. Further, the auxiliary pattern 204 may be formed from the material having a refractive index different from a material of the reticle 202. Therefore, the auxiliary pattern 204 may be formed of, for example, air or SiOx ($0.1 \leq x \leq 0.99$). For instance, an empty space including air may be provided to form the auxiliary pattern 204.

First and second light-shielding patterns 206a, 206b are formed on the reticle 202. The light-shielding patterns 206a, 206b may be formed of an opaque material, such as chrome (Cr), through which light cannot be transmitted in the light exposure process. Accordingly, the light-shielding patterns 206a, 206b may be formed on a portion of the reticle 202 where light does not transmit and light-transmitting patterns are formed in certain portions of the reticle 202 where the light-shielding patterns 206a, 206b are not formed and allows light to transmit therethrough.

The first light-shielding pattern 206a is a pattern for forming an overlay vernier in the etching object layer 104 and the second light-shielding patterns 206b are patterns for forming real patterns in the etching object layer 104. In particular, the first light-shielding pattern 206a may come in contact with the auxiliary pattern 204 and formed in a size which may be included in the reticle 202. In general, the overlay vernier formed in the etching object layer 104 is larger in size than the real pattern, so as the first light-shielding pattern 206a is formed to be larger than the second light-shielding patterns 206b. Further, the overlay vernier formed in the etching object layer 104 may be formed independently, whereas the real patterns are formed in a plural number at narrow intervals. Thus, the first light-shielding pattern 206a is formed solely and the second light-shielding patterns 206b are formed in a plural number at narrow intervals.

Thereafter, a selective exposure process employing the light-transmitting patterns 206a, 206b formed on the reticle 202 is performed on the photoresist formed on the etching object layer 104. Here, the photoresist may be focused accurately since light passing through the second light-shielding patterns 206b does not have a refraction. However, light passing through the first light-shielding pattern 206a is refracted between the auxiliary pattern 204 and the first light-shielding pattern 206a and may be not accurately focused on the photoresist. Thus, there is a difference in the exposure degree between top and bottom of the photoresist, which makes vague the boundary of exposed portions and unexposed portions.

A development process is then performed on the exposed photoresist, thus forming the first and second photoresist patterns 106a, 106b on the etching object layer 104. Here, the first photoresist pattern 106a is a pattern for forming the overlay vernier in the etching object layer 104 and the second photoresist patterns 106b are patterns for forming the real patterns in the etching object layer 104. The first photoresist pattern 106a may be formed to have inclined sidewalls (indicated by "C") after the exposure process is being performed using light that is not focused in the above exposure process.

Referring to FIG. 1B, an overlay vernier 104a and real patterns 104b are formed by performing an etching process, employing the photoresist patterns 106a, 106b formed on the etching object layer 104. The overlay vernier 104a and the real patterns 104b may have the same profile as the photoresist patterns 106a, 106b that had been formed on top of the substrate 102. Thus, sidewalls (indicated by "D") of the overlay vernier 104a may be formed to have inclination.

Referring now to FIG. 1C, a thin film 108 is formed on the overlay vernier 104a and the real patterns 104b. Here, the thin film 108 may be easily formed on the sidewalls of the overlay vernier 104a due to the inclination formed on the sidewalls of the overlay vernier 104a. Thus, the overlay vernier 104a is not damaged.

As described above, according to an embodiment of the invention, the etching object layer 104 is formed on the semiconductor substrate 102 and the patterns are then formed on the etching object layer 104. However, it is to be understood that the patterns may be formed directly on the semiconductor substrate 102 without forming the etching object layer 104.

In accordance with the photomask and the method of forming an overlay vernier of a semiconductor device employing the same according to the invention, an auxiliary pattern may be formed in an overlay vernier light-shielding pattern of a reticle by using material having a refractive index different from the reticle and an exposure process is then performed on a photoresist. Thus, inclination may be formed on sidewalls of the overlay vernier and a thin film may be easily formed on the overlay vernier. Accordingly, since the overlay vernier keeps intact without being damaged in a subsequent process, alignment error is not generated when aligning upper and lower layers, enabling a more micro semiconductor fabrication process.

The embodiment disclosed herein has been proposed to allow a person skilled in the art to easily implement the patent. Therefore, the scope of the patent is not limited by or to the embodiment as described above, and should be construed to be defined only by the appended claims and their equivalents.

What is claimed is:

1. A photomask, comprising:
   a light transmission layer formed of a first material;
   a first pattern and a second pattern formed on the light transmission layer and formed of a material for shielding light, wherein a size of the second pattern is smaller than that of the first pattern; and
   an auxiliary pattern having two sides and formed in the light transmission layer to contact the first pattern and formed of a second material for transmitting light, wherein the second material has a refractive index different from the refractive index of the first material;
   wherein the first pattern is smaller than the auxiliary pattern such that the first pattern overlaps the auxiliary pattern to expose both sides of the auxiliary pattern, and wherein the second pattern is isolated from the first pattern and the auxiliary pattern to expose the light transmission layer at both sides of the auxiliary pattern.

2. The photomask of claim 1, wherein the first material of the light transmission layer comprises $SiO_2$.

3. The photomask of claim 1, wherein the second material of the auxiliary pattern includes air or $SiO_x$ ($0.1 \leq x \leq 0.99$).

4. The photomask of claim 1, wherein the first pattern includes a pattern for forming an overlay vernier.

5. The photomask of claim 4, wherein the overlay vernier includes inclined sidewalls.

6. The photomask of claim 5, wherein the overlay vernier being covered with a thin film, and the thin film provides protection to the overlay vernier.

7. A method of forming an overlay vernier of a semiconductor device, the method comprising:
　　forming an etching object layer on a semiconductor substrate;
　　forming a photoresist on the etching object layer;
　　performing an exposure process on the photoresist by employing a photomask where a first light-shielding pattern and a second light-shielding pattern are formed on a light transmission layer for transmitting light and an auxiliary pattern for transmitting light, the second light-shielding pattern having a size smaller than the first light-shielding pattern, the auxiliary pattern has two sides and is formed in the light transmission layer and contacts the first light-shielding pattern and is formed from a material having a refractive index different from a refractive index of a material of the light transmission layer, the first light-shielding pattern being smaller than the auxiliary pattern such that the first light-shielding pattern overlaps the auxiliary pattern to expose both sides of the auxiliary pattern and the second light-shielding pattern is isolated from the first light-shielding pattern and the auxiliary pattern to expose the light transmission layer at both sides of the auxiliary pattern;
　　forming photoresist patterns by performing a development process on the photoresist; and
　　etching the etching object layer by employing the photoresist patterns.

8. The method of claim 7, wherein the light transmission layer is formed of $SiO_2$.

9. The method of claim 7, wherein the auxiliary pattern is formed of air or $SiO_x$ ($0.1 \leq x \leq 0.99$).

10. The method of claim 7, wherein the photoresist pattern formed using the first light-shielding pattern, exposing both sides of the auxiliary pattern and the light transmission layer at both sides of the auxiliary pattern is formed to have inclined sidewalls.

11. The method of claim 7, wherein the photoresist pattern formed using the first light-shielding patterns, exposing both sides of the auxiliary pattern and the light transmission layer at both sides of the auxiliary pattern includes a pattern for forming an overlay vernier.

12. The method of claim 11, wherein the overlay vernier is formed to have inclined sidewalls.

13. The method of claim 12, wherein providing a thin film to the overlay vernier and covering the overlay vernier.

14. A method of forming an overlay vernier of a semiconductor device, the method comprising:
　　providing a semiconductor substrate;
　　forming a photoresist on the substrate;
　　performing an exposure process on the photoresist by employing a photomask where a first light-shielding pattern and a second light-shielding pattern are formed on a light transmission layer and an auxiliary pattern for transmitting light, the second light-shielding pattern having a size smaller than the first light-shielding pattern, the auxiliary pattern is formed in the light transmission layer has two sides and contacts the first light-shielding pattern and is formed from a material having a refractive index different from a refractive index of a material of the light transmission layer, the first light-shielding pattern is smaller than the auxiliary pattern such that the first light-shielding pattern overlaps the auxiliary pattern to expose both sides of the auxiliary pattern, and the second light-shielding pattern is isolated from the first light-shielding pattern and the auxiliary pattern to expose the light transmission layer at both sides of the auxiliary pattern; and
　　forming photoresist patterns by performing a development process on the photoresist.

15. The method of claim 14, wherein the light transmission layer is formed of $SiO_2$.

16. The method of claim 14, the auxiliary pattern is formed of air or $SiO_x$ ($0.1 \leq x \leq 0.99$).

17. The method of claim 14, wherein the photoresist pattern formed using the first light-shielding pattern, exposing both sides of the auxiliary pattern and the light transmission layer at both sides of the auxiliary pattern is formed to have inclined sidewalls.

18. The method of claim 14, wherein the photoresist pattern formed using the first light-shielding patterns, exposing both sides of the auxiliary pattern and the light transmission layer at both sides of the auxiliary pattern includes a pattern for forming an overlay vernier.

19. The method of claim 14, wherein providing a thin film to the overlay vernier and covering the overlay vernier.

* * * * *